(12) United States Patent
Tseng et al.

(10) Patent No.: US 11,764,344 B2
(45) Date of Patent: Sep. 19, 2023

(54) PACKAGE STRUCTURE AND MANUFACTURING METHOD THEREOF

(71) Applicant: Unimicron Technology Corp., Taoyuan (TW)

(72) Inventors: Tzyy-Jang Tseng, Taoyuan (TW); Cheng-Ta Ko, Taipei (TW); Pu-Ju Lin, Hsinchu (TW); Chi-Hai Kuo, Taoyuan (TW); Kai-Ming Yang, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 89 days.

(21) Appl. No.: 17/209,110

(22) Filed: Mar. 22, 2021

(65) Prior Publication Data

US 2022/0246810 A1 Aug. 4, 2022

(30) Foreign Application Priority Data

Feb. 4, 2021 (TW) ................................. 110104120

(51) Int. Cl.
*H01L 33/62* (2010.01)
*H01L 33/06* (2010.01)
(Continued)

(52) U.S. Cl.
CPC .......... *H01L 33/06* (2013.01); *H01L 21/4853* (2013.01); *H01L 21/4857* (2013.01);
(Continued)

(58) Field of Classification Search
CPC . H01L 33/62; H01L 21/4853; H01L 21/4857; H01L 21/565; H01L 21/568;
(Continued)

(56) References Cited

U.S. PATENT DOCUMENTS

| 7,222,421 B2 * | 5/2007 | Nakamura | ........... H05K 3/0058 29/830 |
| 8,120,148 B2 * | 2/2012 | Chen | ....................... H01L 21/56 438/123 |

(Continued)

FOREIGN PATENT DOCUMENTS

| TW | 201212743 | 3/2012 |
| TW | 201717724 | 5/2017 |

(Continued)

OTHER PUBLICATIONS

"Office Action of Taiwan Counterpart Application", dated Sep. 14, 2021, p. 1-p. 15.

*Primary Examiner* — Vu A Vu
(74) *Attorney, Agent, or Firm* — JCIPRNET

(57) ABSTRACT

A manufacturing method of a package structure is provided, which includes the following steps. A carrier having a surface is provided. A copper foil layer is laminated on the surface of the carrier. A subtractive process is performed on the copper foil layer to form a copper foil circuit layer on the carrier. The copper foil circuit layer exposes a part of the surface of the carrier. A build-up structure layer is formed on the copper foil circuit layer and the surface of the carrier. A first surface of the copper foil circuit layer is aligned with a second surface of the build-up structure layer. At least one electronic component is disposed on the build-up structure layer. A package colloid is formed to cover the electronic component and the build-up structure layer. The carrier is removed to expose the first surface of the copper foil circuit layer.

20 Claims, 10 Drawing Sheets

(51) Int. Cl.
*H01L 23/31* (2006.01)
*H01L 23/538* (2006.01)
*H01L 21/683* (2006.01)
*H01L 21/48* (2006.01)
*H01L 21/56* (2006.01)
*H01L 33/54* (2010.01)

(52) U.S. Cl.
CPC .......... *H01L 21/565* (2013.01); *H01L 21/568* (2013.01); *H01L 21/6835* (2013.01); *H01L 23/3121* (2013.01); *H01L 23/5383* (2013.01); *H01L 23/5386* (2013.01); *H01L 33/54* (2013.01); *H01L 2221/6835* (2013.01); *H01L 2933/005* (2013.01); *H01L 2933/0066* (2013.01)

(58) Field of Classification Search
CPC ............. H01L 21/6835; H01L 23/3121; H01L 23/5383; H01L 23/5386; H01L 33/54; H01L 2221/6835; H01L 2933/005; H01L 2933/0066
USPC .......................................................... 257/99
See application file for complete search history.

(56) References Cited

U.S. PATENT DOCUMENTS

| | | | |
|---|---|---|---|
| 8,707,554 B2* | 4/2014 | Maeda | H05K 1/111 |
| | | | 29/830 |
| 9,559,045 B2* | 1/2017 | Pan | H01L 21/486 |
| 9,578,750 B2* | 2/2017 | Sun | H05K 3/0097 |
| 9,847,244 B2* | 12/2017 | Rusli | H01L 23/49838 |
| 10,325,855 B2* | 6/2019 | Kim | H01L 24/20 |
| 10,535,632 B2* | 1/2020 | Jeng | H01L 24/20 |
| 10,586,746 B2* | 3/2020 | Rusli | H01L 22/30 |
| 10,707,178 B2* | 7/2020 | Sato | H01L 21/565 |
| 10,840,180 B2* | 11/2020 | Matsuura | H01L 23/49822 |
| 11,088,059 B2* | 8/2021 | Chen | H01L 21/4853 |
| 11,139,179 B2* | 10/2021 | Chen | H01L 24/73 |
| 11,393,745 B2* | 7/2022 | Lee | H01L 24/19 |
| 2014/0036465 A1* | 2/2014 | Hu | H05K 1/181 |
| | | | 361/767 |
| 2020/0035591 A1* | 1/2020 | Hu | G01R 3/00 |

FOREIGN PATENT DOCUMENTS

| | | |
|---|---|---|
| TW | I662660 | 6/2019 |
| TW | I669034 | 8/2019 |
| TW | 202038346 | 10/2020 |

* cited by examiner

PACKAGE STRUCTURE AND MANUFACTURING METHOD THEREOF

CROSS-REFERENCE TO RELATED APPLICATION

This application claims the priority benefit of Taiwan application serial no. 110104120, filed on Feb. 4, 2021. The entirety of the above-mentioned patent application is hereby incorporated by reference herein and made a part of this specification.

BACKGROUND

Technical Field

The invention relates to a semiconductor structure and a manufacturing method thereof, and particularly relates to a package structure and a manufacturing method thereof.

Description of Related Art

When a micro light-emitting diode (LED) substrate or a mini LED substrate is fabricated, a surface flatness of metal pads of the outermost layer thereof that are bonded with LED chips must be less than 2 μm. However, in a fabrication process of a substrate or a redistribution layer, as a liquid or dry film type material is used as a dielectric layer to build up the layers, and a subsequent electroplating process is performed, it is easy to cause an uneven surface of the formed metal pads, so that it is unable to smoothly assemble the micro LEDs or mini LEDs transferred through mass transfer on the metal pads of the substrate, which reduces the reliability of the product.

SUMMARY

The invention is directed to a package structure, which has better structural reliability.

The invention is directed to a manufacturing method of a package structure, which is adapted to manufacture the package structure and has a better process yield.

The invention provides a manufacturing method of a package structure, which includes following steps. A carrier is provided, wherein the carrier has a surface. A copper foil layer is laminated on the surface of the carrier. A subtractive process is performed on the copper foil layer to form a copper foil circuit layer on the carrier. The copper foil circuit layer exposes a part of the surface of the carrier. A build-up structure layer is formed on the copper foil circuit layer and the surface of the carrier. A first surface of the copper foil circuit layer is aligned with a second surface of the build-up structure layer. At least one electronic component is disposed on the build-up structure layer. A package colloid is formed to cover the electronic component and the build-up structure layer. The carrier is removed to expose the first surface of the copper foil circuit layer.

In an embodiment of the invention, the carrier includes a substrate, a release film and an adhesive layer. The release film is disposed on the substrate. The adhesive layer is disposed on the release film and is located between the release film and the copper foil layer.

In an embodiment of the invention, the step of removing the carrier includes: performing a laser removal process to remove the substrate to expose the release film; peeling off the release film to expose the adhesive layer; and performing an etching process to remove the adhesive layer to expose the first surface of the copper foil circuit layer.

In an embodiment of the invention, the manufacturing method of the package structure further includes: forming a surface treatment layer on the first surface of the copper foil circuit layer.

In an embodiment of the invention, the step of removing the carrier includes: performing a laser removal process to remove the substrate to expose the release film; peeling off the release film to expose the adhesive layer; and performing a laser drilling process to remove a part of the adhesive layer to expose a part of the first surface of the copper foil circuit layer.

In an embodiment of the invention, the manufacturing method of the package structure further includes: forming a surface treatment layer on the first surface of the copper foil circuit layer exposed by the adhesive layer.

In an embodiment of the invention, the build-up structure layer includes at least one insulating layer, at least one build-up circuit layer and at least one conductive via. The insulating layer covers the copper foil circuit layer, the build-up circuit layer is disposed on the insulating layer, and the conductive via penetrates through the insulating layer and is electrically connected to the build-up circuit layer and the copper foil circuit layer.

In an embodiment of the invention, before the step of forming the package colloid, the method further includes: forming a surface treatment layer on a third surface of the build-up structure layer opposite to the second surface, wherein the electronic component directly contacts the surface treatment layer.

In an embodiment of the invention, the electronic component includes at least one micro LED, at least one resistor, at least one capacitor, at least one driving integrated circuit (IC), at least one application processor (AP), at least one memory, or at least one high performance computing (HPC) chip.

The invention provides a manufacturing method of a package structure, which includes following steps. A first carrier is provided, wherein the first carrier has a surface. A copper foil layer is laminated on the surface of the first carrier. A subtractive process is performed on the copper foil layer to form a copper foil circuit layer on the first carrier. The copper foil circuit layer exposes a part of the surface of the first carrier. A build-up structure layer is formed on the copper foil circuit layer and the surface of the first carrier. A first surface of the copper foil circuit layer is aligned with a second surface of the build-up structure layer. A second carrier is provided on a third surface of the build-up structure layer opposite to the second surface. The first carrier is removed after providing the second carrier, so as to expose the first surface of the copper foil circuit layer and the second surface of the build-up structure layer. At least one electronic component is disposed on the first surface of the copper foil circuit layer. A package colloid is formed to cover the electronic component and the build-up structure layer. The second carrier is removed to expose the third surface of the build-up structure layer.

In an embodiment of the invention, the first carrier includes a substrate, a release film and an adhesive layer. The release film is disposed on the substrate. The adhesive layer is disposed on the release film and is located between the release film and the copper foil layer.

In an embodiment of the invention, after the step of forming the build-up structure layer, and before the step of providing the second carrier, the method further includes: forming a surface treatment layer on the third surface of the build-up structure layer.

In an embodiment of the invention, after the step of removing the first carrier, and before the step of disposing the electronic component on the first surface of the copper foil circuit layer, the method further includes: forming a surface treatment layer on the first surface of the copper foil circuit layer.

In an embodiment of the invention, the build-up structure layer includes at least one insulating layer, at least one build-up circuit layer and at least one conductive via. The insulating layer covers the copper foil circuit layer, the build-up circuit layer is disposed on the insulating layer, and the conductive via penetrates through the insulating layer and is electrically connected to the build-up circuit layer and the copper foil circuit layer.

In an embodiment of the invention, the electronic component includes at least one micro LED, at least one resistor, at least one capacitor, at least one driving integrated circuit (IC), at least one application processor (AP), at least one memory, or at least one high performance computing (HPC) chip.

The invention provides a package structure including a copper foil circuit layer, a build-up structure layer, at least one electronic component and a package colloid. The build-up structure layer is disposed on the copper foil circuit layer, wherein a first surface of the copper foil circuit layer is aligned with a second surface of the build-up structure layer. The electronic component is disposed on the build-up structure layer. The package colloid covers the electronic component and the build-up structure layer.

In an embodiment of the invention, the package structure further includes an adhesive layer, a first surface treatment layer and a second surface treatment layer. The adhesive layer is disposed on the second surface of the build-up structure layer and exposes a part of the copper foil circuit layer. The first surface treatment layer is disposed on a third surface of the build-up structure layer opposite to the second surface. The electronic component directly contacts the first surface treatment layer. The second surface treatment layer is disposed on the copper foil circuit layer exposed by the adhesive layer.

In an embodiment of the invention, the package structure further includes a first surface treatment layer and a second surface treatment layer. The first surface treatment layer is disposed on a third surface of the build-up structure layer opposite to the second surface, wherein the electronic component directly contacts the first surface treatment layer. The second surface treatment layer is disposed on the first surface of the copper foil circuit layer.

In an embodiment of the invention, the package structure further includes a first surface treatment layer and a second surface treatment layer. The first surface treatment layer is disposed on the first surface of the copper foil circuit layer, wherein the electronic component directly contacts the first surface treatment layer. The second surface treatment layer is disposed on a third surface of the build-up structure layer opposite to the second surface.

In an embodiment of the invention, the build-up structure layer includes at least one insulating layer, at least one build-up circuit layer and at least one conductive via. The insulating layer covers the copper foil circuit layer, the build-up circuit layer is disposed on the insulating layer, and the conductive via penetrates through the insulating layer and is electrically connected to the build-up circuit layer and the copper foil circuit layer.

In an embodiment of the invention, an orthogonal projection of the electronic component on the build-up structure layer is not overlapped with the conductive via.

Based on the above description, in the manufacturing method of the package structure, the copper foil layer is first laminated on the carrier, and then the subtractive process is performed on the copper foil layer to form the copper foil circuit layer on the carrier. Thereafter, the build-up structure layer is formed on the copper foil circuit layer. By controlling the flatness of the build-up circuit layer through the arrangement and fabrication of the copper foil circuit layer, subsequent coplanar assembling pads are obtained, which improves a yield of subsequently docking the electronic components and the build-up structure layer. In this way, the package structure of the invention has better structural reliability. In addition, the subtractive process has fewer steps, which avails reducing production costs and simplifies process steps, and achieves the advantage that a surface coplanarity of the copper foil circuit layer is less than 2 μm.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
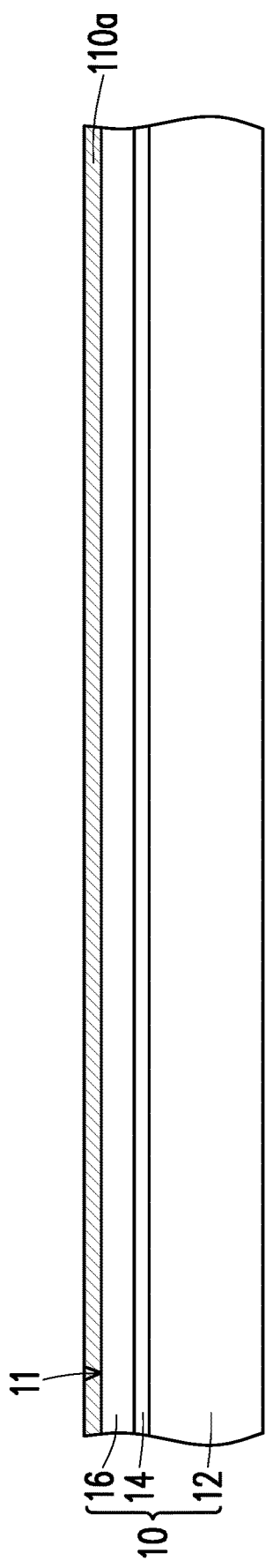
FIG. 1A to 1G are schematic cross-sectional views of a manufacturing method of a package structure according to an embodiment of the invention.

FIG. 1A to 1G are schematic cross-sectional views of a manufacturing method of a package structure according to an embodiment of the invention. Regarding the manufacturing method of the package structure of the embodiment, first, referring to FIG. 1A, a carrier 10 is provided, where the carrier 10 has a surface 11. In detail, the carrier 10 of the embodiment includes a substrate 12, a release film 14 and an adhesive layer 16. The release film 14 is disposed on the substrate 12, and the adhesive layer 16 is disposed on the release film 14, where the release film 14 is located between the substrate 12 and the adhesive layer 16. The carrier 10 is, for example, a glass substrate, a glass fiber (FR4) substrate, a BT resin substrate, or a ceramic substrate. The adhesive layer 16 includes a surface 11, and a material of the adhesive layer 16 is, for example, Ajinomoto build-up film (ABF) resin, polyimide or epoxy, but the invention is not limited thereto.

Then, referring to FIG. 1A, a copper foil layer 110a is laminated on the surface 11 of the carrier 10, where the adhesive layer 16 is located between the release film 14 and the copper foil layer 110a. Namely, in the embodiment, the copper foil layer 110a is adhered to the carrier 10 through the adhesive layer 16.

Figure 1B:
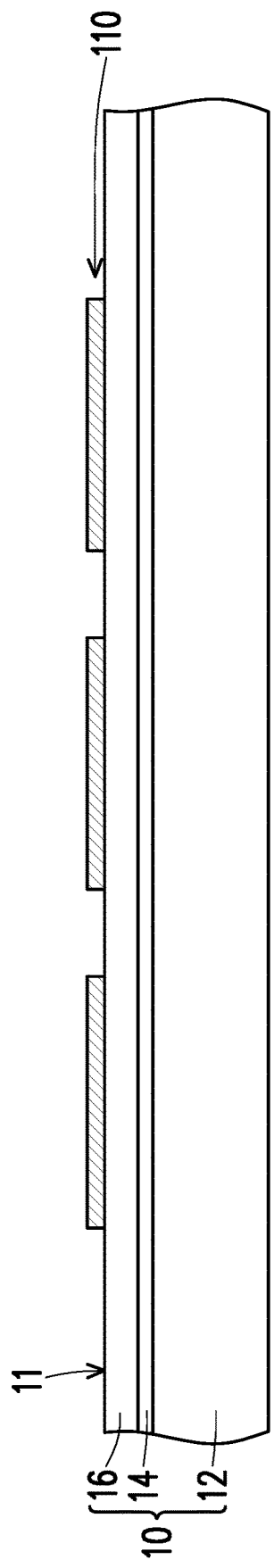

Then, referring to FIG. 1B, A subtractive process is performed on the copper foil layer 110a to form a copper foil circuit layer 110 on the carrier 10. At this time, the copper foil circuit layer 110 exposes a part of the surface 11 of the carrier 10. The subtractive process is a method of selectively removing a part of copper foil on a copper foil-clad laminate surface to obtain a conductive circuit pattern.

Figure 1C:
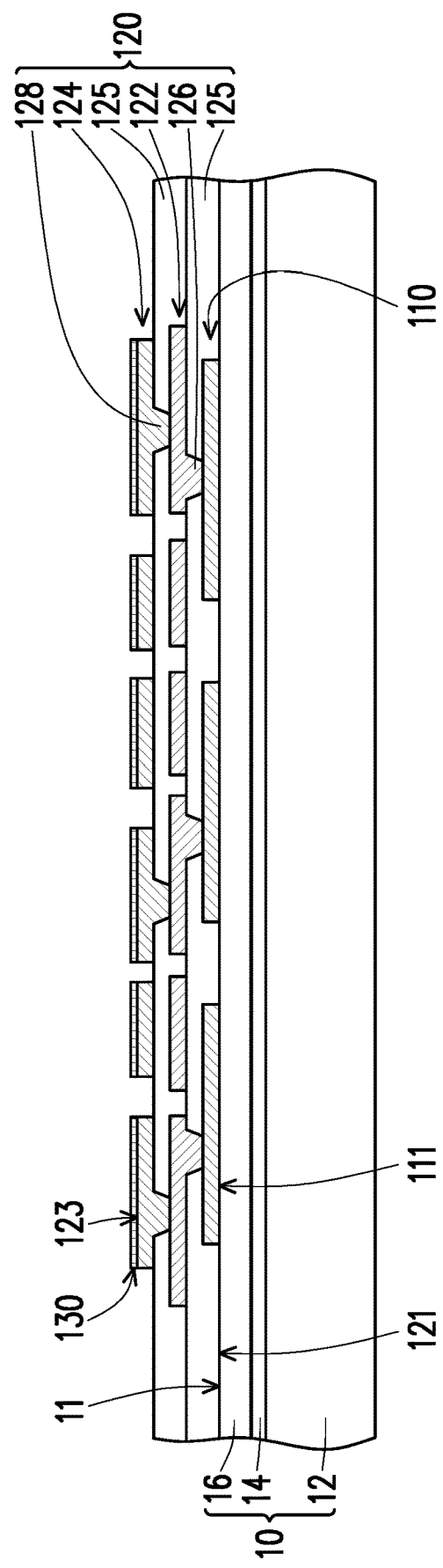

Then, referring to FIG. 1C, a build-up structure layer 120 is formed on the copper foil circuit layer 110 and the surface 11 of the carrier 10. In detail, the build-up structure layer 120 includes at least one insulating layer (two insulating layers 125 are schematically shown), at least one build-up circuit layer (two build-up circuit layers 122 and 124 are schematically shown), and at least one conductive via (a plurality of conductive vias 126 and 128 are schematically shown). The insulating layer 125 covers the copper foil circuit layer 110, and the build-up circuit layer 124 is disposed on the insulating layer 125. The conductive vias 126 and 128 penetrate through the insulating layer 125, and the conductive via 126 is electrically connected to the build-up circuit layer 122 and the copper foil circuit layer 110, and the conductive via 126 is electrically connected to the build-up circuit layer 122 and the build-up circuit layer 124. In particular, a first surface 111 of the copper foil circuit layer 110 is aligned with a second surface 121 of the build-up structure layer 120. The insulating layer 125 is, for example, Ajinomoto build-up film (ABF) resin, polyimide (polyimide), or epoxy (epoxy), but the invention is not limited thereto.

Then, referring to FIG. 1C again, a surface treatment layer 130 is formed on a third surface 123 of the build-up structure layer 120 opposite to the second surface 121 to protect the build-up circuit layer 124 to avoid oxidation. Here, a material of the surface treatment layer 130 is, for example, a nickel layer, a gold layer, a silver layer or a nickel-palladium-gold layer, but the invention is not limited thereto.

Figure 1D:
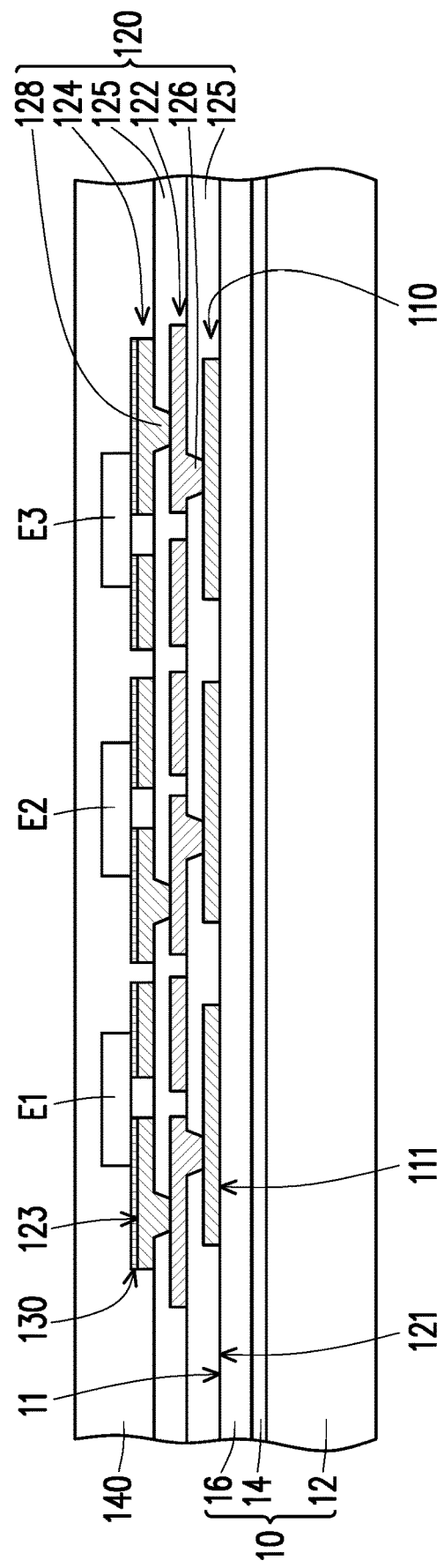

Then, referring to FIG. 1D, At least one electronic component (three electronic components E1, E2, E3 are schematically shown) is disposed on the build-up structure layer 120, where the electronic components E1, E2, E3 directly contact the surface treatment layer 130. A method of configuring the electronic components E1, E2, and E3 is to bond the electronic components E1, E2, and E3 to the build-up circuit layer 124 of the build-up structure layer 120 by means of mass transfer. The electronic components E1, E2, and E3 are, for example, micro LEDs, but the invention is not limited thereto. In other embodiments, the electronic components E1, E2, E3 may also be resistors, capacitors, driving integrated circuits (ICs), application processors (APs), memories or high-performance computing (HPC) chips, but the invention is not limited thereto.

Then, referring to FIG. 1D, a package colloid 140 is formed to cover the electronic components E1, E2 and E3, the build-up structure layer 120 and the surface treatment layer 130.

Figure 1E:
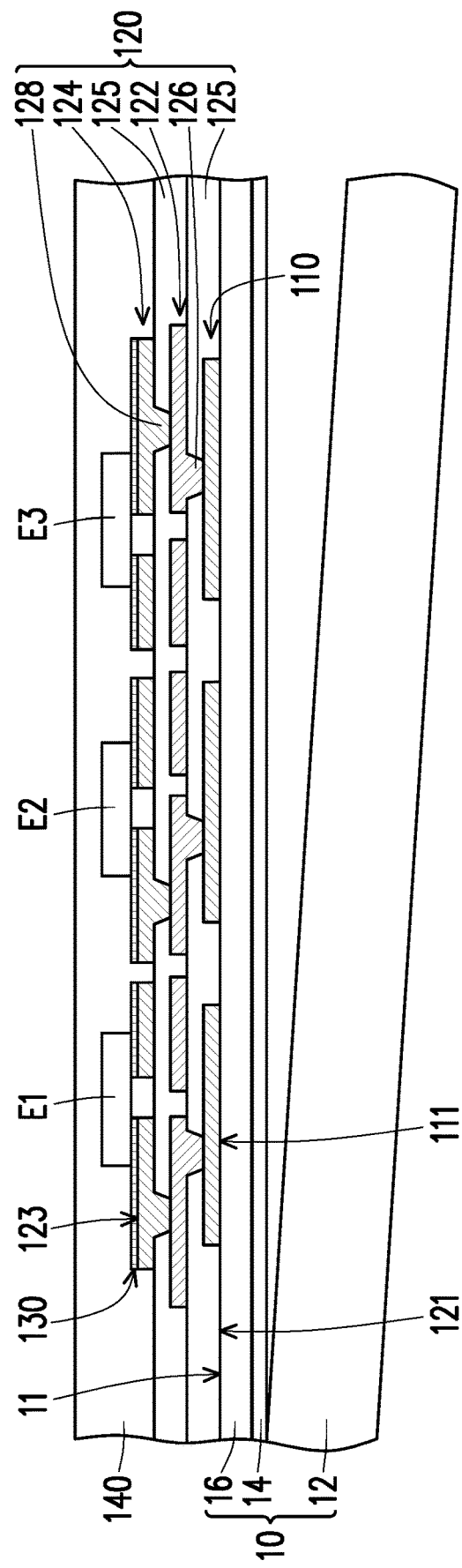
Figure 1F:
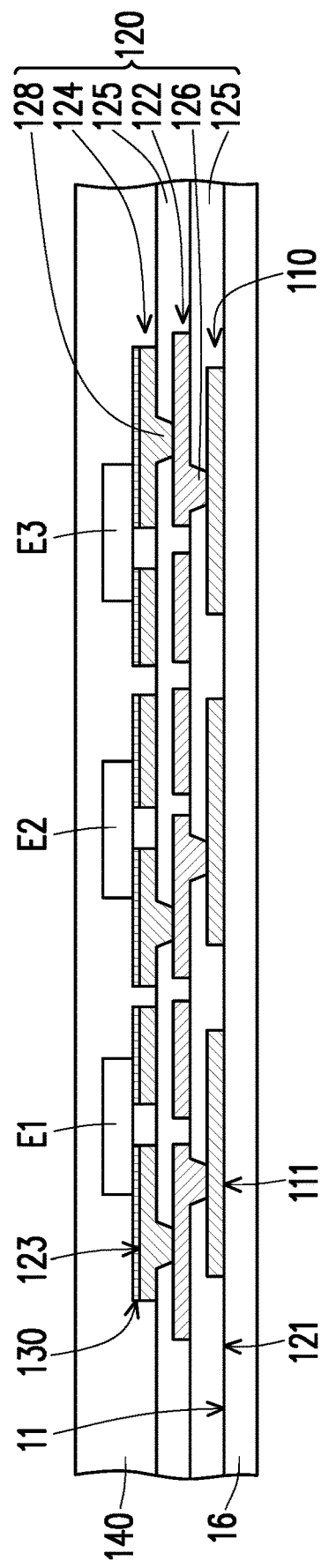

Then, referring to FIG. 1E, a laser removal process is performed to remove the substrate 12 to expose the release film 14. Then, referring to FIG. 1E and FIG. 1F at the same time, the release film 14 is peeled off to expose the adhesive layer 16. Thereafter, referring to FIG. 1G, a laser drilling process is performed to remove a part of the adhesive layer 16 to form the adhesive layer 145 with an opening 147, and the opening 147 exposes a part of the first surface 111 of the copper foil circuit layer 110.

Finally, referring to FIG. 1G again, a surface treatment layer 150a is formed on the first surface 111 of the copper foil circuit layer 110 exposed by the adhesive layer 145 to protect the copper foil circuit layer 110 exposed by the opening 147, so as to avoid oxidation. Here, a material of the surface treatment layer 150a is, for example, a nickel layer, a gold layer, a silver layer or a nickel-palladium-gold layer, but the invention is not limited thereto. In this way, fabrication of the package structure 100a is completed.

In terms of structure, referring to FIG. 1G again, the package structure 100a includes the copper foil circuit layer 110, the build-up structure layer 120, the electronic components E1, E2, E3, and the package colloid 140. The build-up structure layer 120 is disposed on the copper foil circuit layer 110, where the first surface 111 of the copper foil circuit layer 110 is aligned with the second surface 121 of the build-up structure layer 120. The electronic components E1, E2, E3 are disposed on the build-up structure layer 120, and the package colloid 140 covers the electronic components E1, E2, E3 and the build-up structure layer 120. The build-up structure layer 120 includes the insulating layer 125, the build-up circuit layers 122 and 124 and the conductive vias 126 and 128. The insulating layer 125 covers the copper foil circuit layer 110, the build-up circuit layer 124 is disposed on the insulating layer 125, and the conductive vias 126 and 128 penetrate through the insulating layer 124 and are electrically connected to the build-up circuit layers 122 and 124 and the copper foil circuit layer 110.

In addition, the package structure 100a of the embodiment further includes the adhesive layer 145, the surface treatment layer 130, and the surface treatment layer 150a. The adhesion layer 145 is disposed on the second surface 121 of the build-up structure layer 120 and exposes a part of the copper foil circuit layer 110. The surface treatment layer 130 is disposed on the third surface 123 of the build-up structure layer 120 opposite to the second surface 121, and the electronic components E1, E2, E3 directly contact the surface treatment layer 130. The surface treatment layer 150a is disposed on the copper foil circuit layer 110 exposed by the adhesive layer 145. Here, the surface treatment layers 130, 150a may be used to protect the build-up circuit layer 124 and the copper foil circuit layer 110 to avoid oxidation, where a material of the surface treatment layers 130, 150a is, for example, a nickel layer, a gold layer, a silver layer or a nickel-palladium-gold layer, but the invention is not limited thereto.

In brief, in the embodiment, by laminating the copper foil layer 110a and using the subtractive process to replace a semi-additive process (SAP) or a modified semi-additive process (MSAP) for copper electroplating in the existing redistribution layer, a copper thickness uniformity in circuit fabrication is enhanced, and since the subtractive process has fewer process steps, it has relatively low cost and may simplify the fabrication process, and may achieve good flatness (less than 2 μm) of the copper foil circuit layer 110. Moreover, through the arrangement and fabrication of the copper foil circuit layer 110, flatness of the build-up structure layer 120 subsequently formed thereon may be controlled, thereby obtaining subsequent coplanar assembling pads, which may improve a yield when the electronic components E1, E2, E3 and the build-up structure layer 120 are subsequently docked. In this way, the package structure 100a of the embodiment may have better structural reliability.

It should be noticed that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 1G:
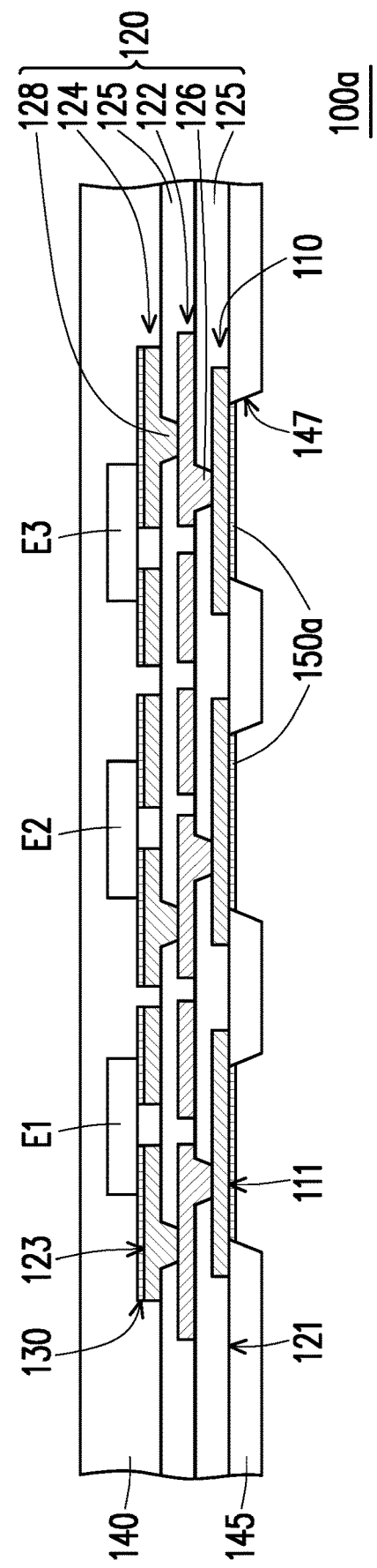
Figure 2:
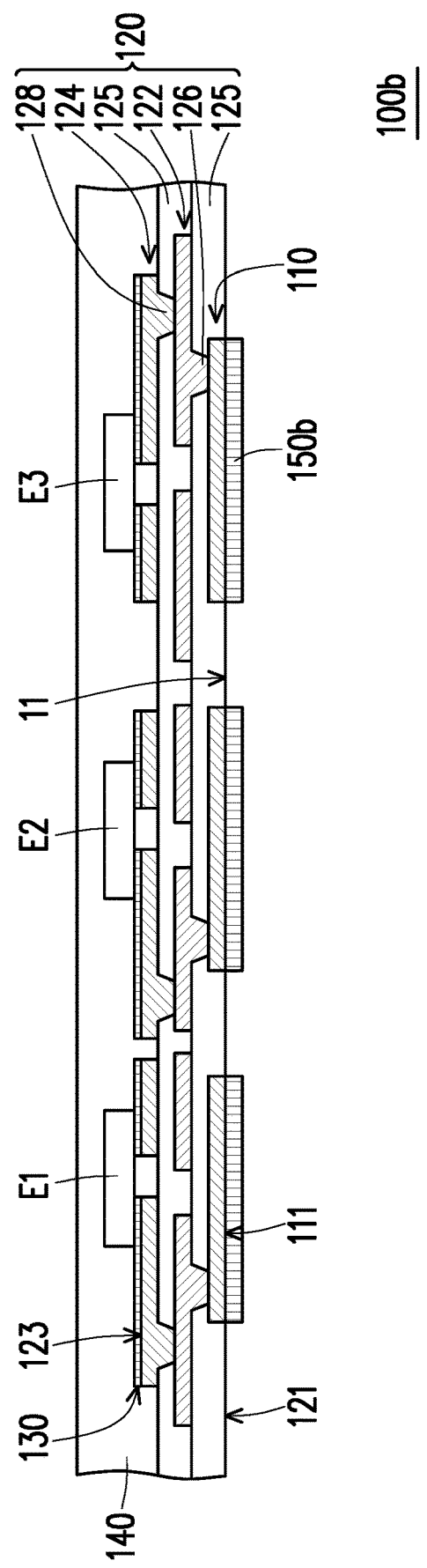
FIG. 2 is a schematic cross-sectional view of a package structure according to an embodiment of the invention.

FIG. 2 is a schematic cross-sectional view of a package structure according to an embodiment of the invention. Referring to FIG. 1G and FIG. 2 at the same time, the package structure of the embodiment is similar to the aforementioned package structure. A difference there between is that in the embodiment, there is no adhesive layer 145, and in order to achieve better coplanarity, orthogonal projections of the electronic components E1, E2, E3 of the embodiment on the build-up structure layer 120 are not overlapped with the conductive vias 126, 128. In detail, a surface treatment layer 150b is disposed on the first surface 111 of the copper foil circuit layer 110 and completely covers the entire first surface 111. In the manufacturing process, referring to FIG. 1F and FIG. 2 at the same time, after the release film 14 is peeled off to expose the adhesive layer 16, an etching process is performed to remove the adhesive layer 16 and expose the first surface 111 of the copper foil circuit layer 110. The etching procedure is, for example, a chemical etching method or a plasma etching method. By now, the carrier 10 is completely removed to expose the entire first surface 111 of the copper foil circuit layer 110. Thereafter, referring to FIG. 2 again, the surface treatment layer 150b is formed on the first surface 111 of the copper foil circuit layer 110. By now, fabrication of the package structure 100b is completed.

Figure 3A:
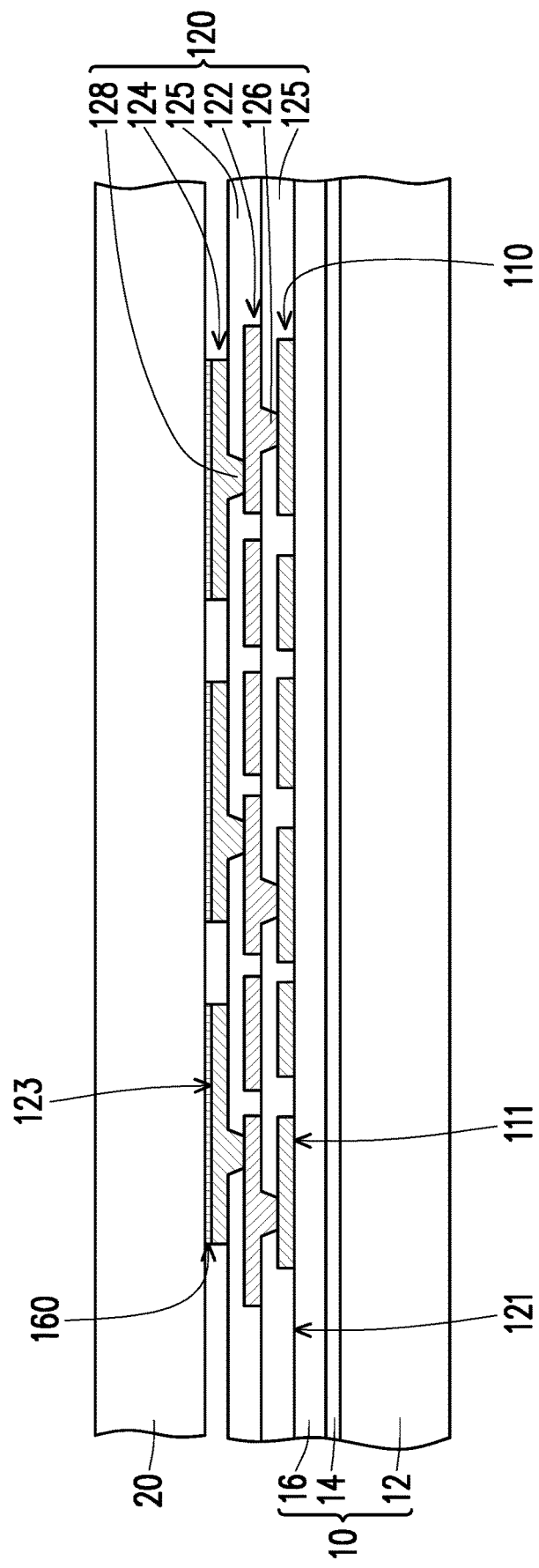
FIG. 3A to FIG. 3D are schematic cross-sectional views of partial steps of a manufacturing method of a package structure according to another embodiment of the invention.

FIG. 3A to FIG. 3D are schematic cross-sectional views of partial steps of a manufacturing method of a package structure according to another embodiment of the invention. Referring to FIGS. 1C and 3A at the same time, the manufacturing method of the package structure of the embodiment is similar to the aforementioned manufacturing method of the package structure, and a difference there between is that in the embodiment, after the surface treatment layer 160 is formed on the third surface 123 of the build-up structure layer 120 opposite to the second surface 121, a carrier 20 is provided on the surface treatment layer 160 located on the third surface 123 of the build-up structure layer 120.

Figure 3B:
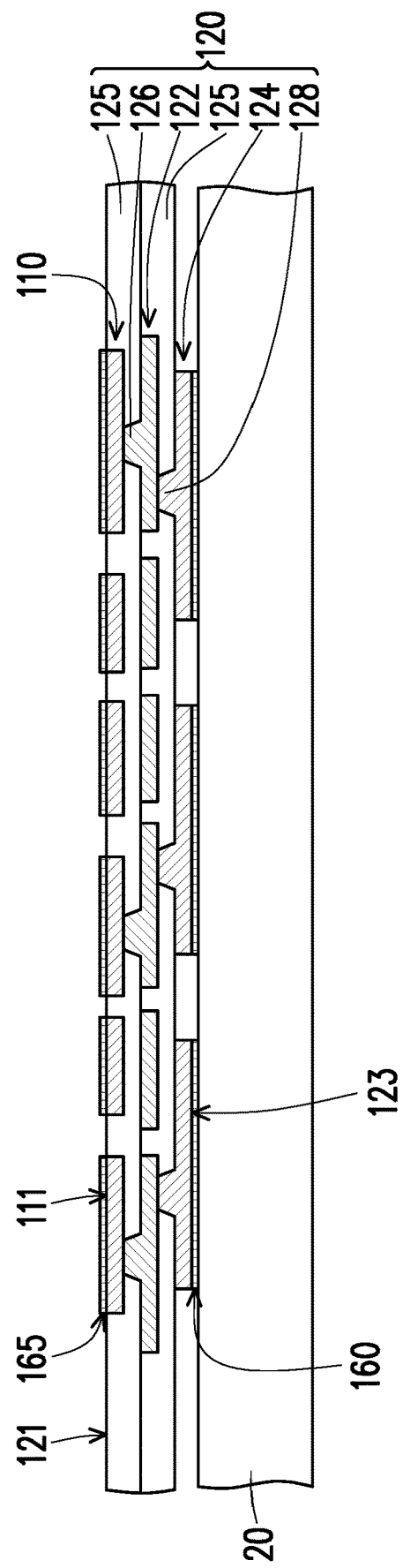

Then, referring to FIG. 3A and FIG. 3B at the same time, the carrier 10 is removed after the carrier 20 is provided, and the carrier 20 is turned over to carry the copper foil circuit layer 110 and the build-up structure layer 120, so as to expose the first surface 111 of the copper foil circuit layer 110 and the second surface 121 of the build-up structure layer 120.

Then, referring to FIG. 3B, a surface treatment layer 165 is formed on the first surface 111 of the copper foil circuit layer 110 to avoid oxidation. A material of the surface treatment layer 165 is, for example, a nickel layer, a gold layer, a silver layer or a nickel-palladium-gold layer, but the invention is not limited thereto.

Figure 3C:
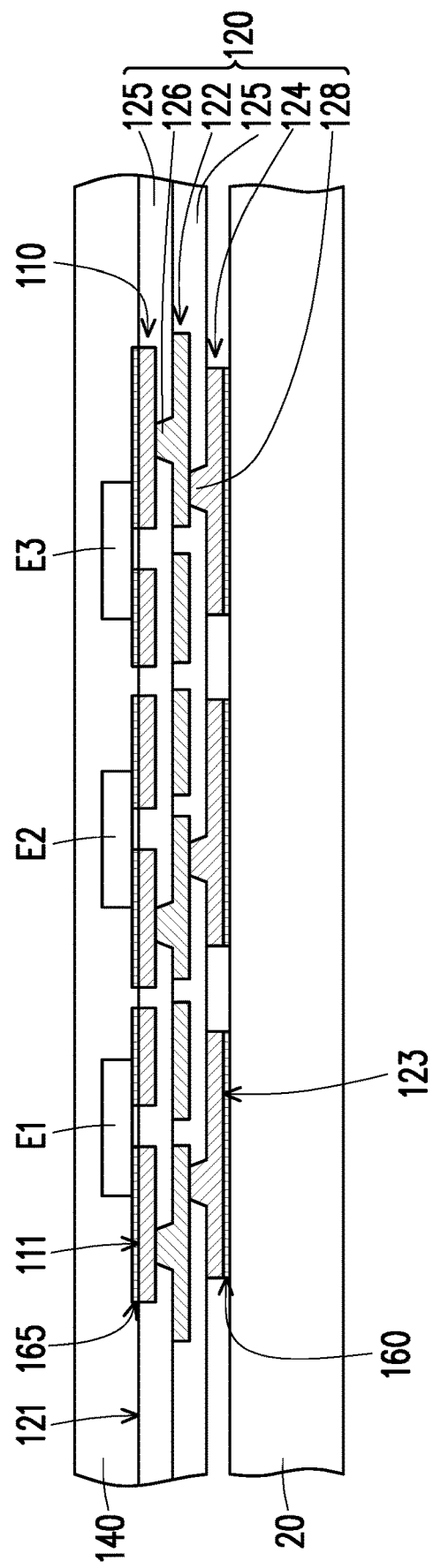

Thereafter, referring to FIG. 3C, the electronic components E1, E2, E3 are disposed on the first surface 111 of the copper foil circuit layer 110. Then, the package colloid 140 is formed to cover the electronic components E1, E2, E3, the build-up structure layer 120 and the surface treatment layer 165.

Figure 3D:
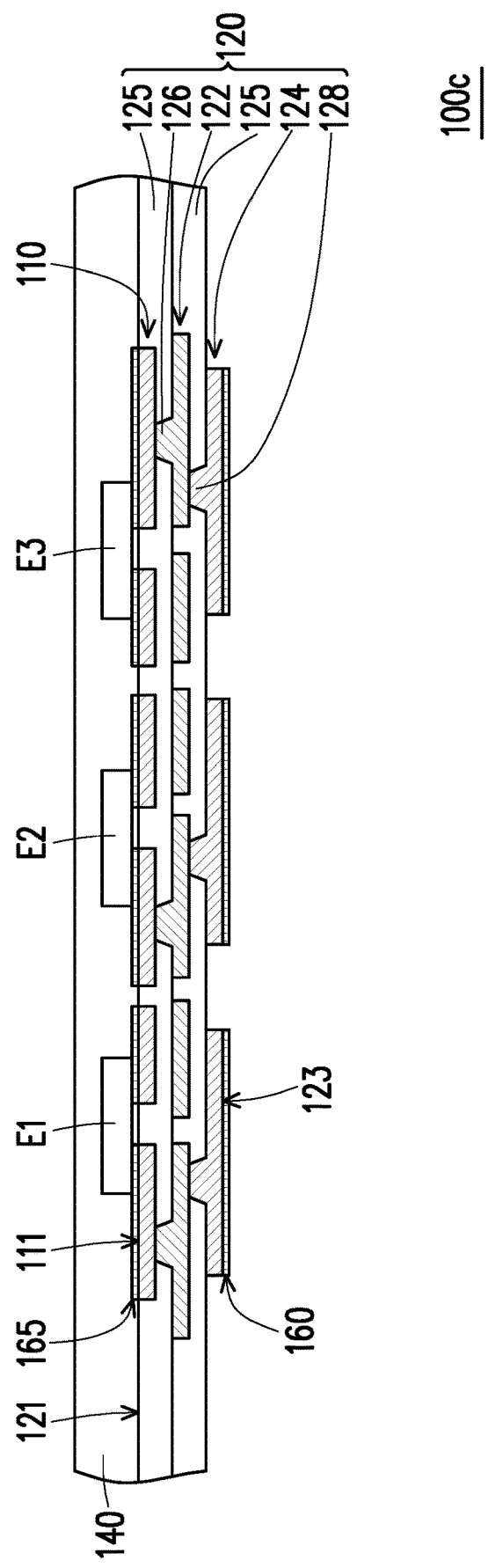

Finally, referring to FIG. 3D, the carrier 20 is removed to expose the surface treatment layer 160 on the third surface 123 of the build-up structure layer 120. At this time, the build-up circuit layer 124 of the build-up structure layer 120 protrudes out from the insulating layer 125, and the surface treatment layer 160 is formed on the build-up circuit layer 124. By now, fabrication of the package structure 100c is completed.

In summary, in the manufacturing method of the package structure, the copper foil layer is first laminated on the carrier, and then the subtractive process is performed on the copper foil layer to form the copper foil circuit layer on the carrier. Thereafter, the build-up structure layer is formed on the copper foil circuit layer. By controlling the flatness of the build-up circuit layer through the arrangement and fabrication of the copper foil circuit layer, subsequent coplanar assembling pads are obtained, which improves a yield of subsequently docking the electronic components and the build-up structure layer. In this way, the package structure of the invention has better structural reliability. In addition, the subtractive process has fewer steps, which avails reducing production costs and simplifies process steps, and achieves the advantage that a surface coplanarity of the copper foil circuit layer is less than 2 μm.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A manufacturing method of a package structure, comprising:
   providing a carrier, wherein the carrier has a surface;
   laminating a copper foil layer on the surface of the carrier;
   performing a subtractive process on the copper foil layer to form a copper foil circuit layer on the carrier, wherein the copper foil circuit layer exposes a part of the surface of the carrier;
   forming a build-up structure layer on the copper foil circuit layer and directly on the surface of the carrier, wherein a first surface of the copper foil circuit layer is aligned with a second surface of the build-up structure layer and the surface of the carrier;
   disposing at least one electronic component on the build-up structure layer;
   forming a first surface treatment layer on a third surface of the build-up structure layer opposite to the second surface, wherein the at least one electronic component directly contacts the first surface treatment layer;
   forming a package colloid to cover the at least one electronic component and the build-up structure layer; and
   removing the carrier to expose the first surface of the copper foil circuit layer.

2. The manufacturing method of the package structure as claimed in claim 1, wherein the carrier comprises:
   a substrate;
   a release film, disposed on the substrate; and
   an adhesive layer, disposed on the release film and located between the release film and the copper foil layer.

3. The manufacturing method of the package structure as claimed in claim 2, wherein the step of removing the carrier comprises:
   performing a laser removal process to remove the substrate to expose the release film;
   peeling off the release film to expose the adhesive layer; and
   performing an etching process to remove the adhesive layer to expose the first surface of the copper foil circuit layer.

4. The manufacturing method of the package structure as claimed in claim 3, further comprising:
   forming a second surface treatment layer on the first surface of the copper foil circuit layer.

5. The manufacturing method of the package structure as claimed in claim 2, wherein the step of removing the carrier comprises:
   performing a laser removal process to remove the substrate to expose the release film;
   peeling off the release film to expose the adhesive layer; and
   performing a laser drilling process to remove a part of the adhesive layer to expose a part of the first surface of the copper foil circuit layer.

6. The manufacturing method of the package structure as claimed in claim 5, further comprising:
   forming a second surface treatment layer on the first surface of the copper foil circuit layer exposed by the adhesive layer.

7. The manufacturing method of the package structure as claimed in claim 1, wherein the build-up structure layer comprises at least one insulating layer, at least one build-up circuit layer, and at least one conductive via, the at least one insulating layer covers the copper foil circuit layer, the at least one build-up circuit layer is disposed on the at least one insulating layer, and the at least one conductive via penetrates through the at least one insulating layer and is electrically connected to the at least one build-up circuit layer and the copper foil circuit layer.

8. The manufacturing method of the package structure as claimed in claim 1, wherein the at least one electronic component comprises at least one micro light-emitting diode, at least one resistor, at least one capacitor, at least one driving integrated circuit, at least one application processor, at least one memory, or at least one high performance computing chip.

9. A manufacturing method of a package structure, comprising:
   providing a first carrier, wherein the first carrier has a surface;
   laminating a copper foil layer on the surface of the first carrier;
   performing a subtractive process on the copper foil layer to form a copper foil circuit layer on the first carrier, wherein the copper foil circuit layer exposes a part of the surface of the first carrier;
   forming a build-up structure layer on the copper foil circuit layer and the surface of the first carrier, wherein a first surface of the copper foil circuit layer is aligned with a second surface of the build-up structure layer;
   providing a second carrier on a third surface of the build-up structure layer opposite to the second surface;
   removing the first carrier after providing the second carrier to expose the first surface of the copper foil circuit layer and the second surface of the build-up structure layer;
   disposing at least one electronic component on the first surface of the copper foil circuit layer;
   forming a package colloid to cover the at least one electronic component and the build-up structure layer; and
   removing the second carrier to expose the third surface of the build-up structure layer.

10. The manufacturing method of the package structure as claimed in claim 9, wherein the first carrier comprises:
    a substrate;
    a release film, disposed on the substrate; and
    an adhesive layer, disposed on the release film and located between the release film and the copper foil layer.

11. The manufacturing method of the package structure as claimed in claim 9, wherein after the step of forming the build-up structure layer and before the step of providing the second carrier, the manufacturing method further comprises:
    forming a first surface treatment layer on the third surface of the build-up structure layer.

12. The manufacturing method of the package structure as claimed in claim 9, wherein after the step of removing the first carrier and before the step of disposing the at least one electronic component on the first surface of the copper foil circuit layer, the manufacturing method further comprises:
    forming a second surface treatment layer on the first surface of the copper foil circuit layer.

13. The manufacturing method of the package structure as claimed in claim 9, wherein the build-up structure layer comprises at least one insulating layer, at least one build-up circuit layer, and at least one conductive via, the at least one insulating layer covers the copper foil circuit layer, the at least one build-up circuit layer is disposed on the at least one insulating layer, and the at least one conductive via penetrates through the at least one insulating layer and is electrically connected to the at least one build-up circuit layer and the copper foil circuit layer.

14. The manufacturing method of the package structure as claimed in claim 9, wherein the at least one electronic component comprises at least one micro light-emitting diode, at least one resistor, at least one capacitor, at least one driving integrated circuit, at least one application processor, at least one memory, or at least one high performance computing chip.

15. A package structure, comprising:
    a copper foil circuit layer;
    a build-up structure layer, disposed on the copper foil circuit layer and comprising at least one insulating layer, wherein a first surface of the copper foil circuit layer is aligned with a second surface of the build-up structure layer, and the at least one insulating layer covers the copper foil circuit layer, wherein a first surface treatment layer, disposed on a third surface of the build-up structure layer opposite to the second surface;
    at least one electronic component, disposed on the build-up structure layer;
    a package colloid, covering the at least one electronic component and the build-up structure layer; and
    a second surface treatment layer, disposed on the first surface of the copper foil circuit layer.

16. The package structure as claimed in claim 15, further comprising:
    an adhesive layer, disposed on the second surface of the build-up structure layer and exposing a part of the copper foil circuit layer,
    wherein the at least one electronic component directly contacts the first surface treatment layer; and
    the second surface treatment layer, disposed on the copper foil circuit layer exposed by the adhesive layer.

17. The package structure as claimed in claim 15, wherein the at least one electronic component directly contacts the first surface treatment layer.

18. The package structure as claimed in claim 15, wherein the at least one electronic component directly contacts the second surface treatment layer.

19. The package structure as claimed in claim 15, wherein the build-up structure layer comprises at least one build-up circuit layer and at least one conductive via, the at least one build-up circuit layer is disposed on the at least one insulating layer, and the at least one conductive via penetrates through the at least one insulating layer and is electrically connected to the at least one build-up circuit layer and the copper foil circuit layer.

20. The package structure as claimed in claim 19, wherein an orthogonal projection of the at least one electronic component on the build-up structure layer is not overlapped with the at least one conductive via.

* * * * *